United States Patent
Rendall

(10) Patent No.: US 11,613,804 B2
(45) Date of Patent: *Mar. 28, 2023

(54) VAPOUR DEPOSITION EVAPORATOR DEVICE

(71) Applicant: Dyson Technology Limited, Wiltshire (GB)

(72) Inventor: Michael Edward Rendall, Newbury (GB)

(73) Assignee: Dyson Technology Limited, Malmesbury (GB)

(*) Notice: Subject to any disclaimer, the term of this patent is extended or adjusted under 35 U.S.C. 154(b) by 0 days.

This patent is subject to a terminal disclaimer.

(21) Appl. No.: 15/734,857

(22) PCT Filed: May 31, 2019

(86) PCT No.: PCT/GB2019/051521
§ 371 (c)(1),
(2) Date: Dec. 3, 2020

(87) PCT Pub. No.: WO2019/234398
PCT Pub. Date: Dec. 12, 2019

(65) Prior Publication Data
US 2021/0230738 A1   Jul. 29, 2021

(30) Foreign Application Priority Data
Jun. 4, 2018 (GB) ..................... 1809089

(51) Int. Cl.
*C23C 14/24* (2006.01)
*C23C 14/26* (2006.01)

(52) U.S. Cl.
CPC .......... *C23C 14/246* (2013.01); *C23C 14/243* (2013.01); *C23C 14/26* (2013.01)

(58) Field of Classification Search
CPC .................................................. C23C 14/246
See application file for complete search history.

(56) References Cited

U.S. PATENT DOCUMENTS 4,722,680 A * 2/1988 Rossberger ............. B29B 7/489
425/203
5,366,207 A * 11/1994 Lin .......................... B22D 1/00
266/216

(Continued)

FOREIGN PATENT DOCUMENTS

CN      1908224 A    2/2007
CN    104379807 A    2/2015

(Continued)

OTHER PUBLICATIONS

English translation JP H06-101029, Yoshida, Apr. 1994 (Year: 1994).*

(Continued)

*Primary Examiner* — Keath T Chen
(74) *Attorney, Agent, or Firm* — Faegre Drinker Biddle & Reath LLP

(57) ABSTRACT

An evaporator device incudes a crucible comprising an inlet through which solid material is introduced to the crucible, and an outlet through which vaporised material is released from the crucible. Vapours outgassed from molten material within the crucible are guided away from the outlet.

16 Claims, 6 Drawing Sheets

(56) References Cited

U.S. PATENT DOCUMENTS

| | | | | |
|---|---|---|---|---|
| 5,561,001 | A | * | 10/1996 | Gurtler .................. H01M 50/35 |
| | | | | 429/86 |
| 5,945,162 | A | * | 8/1999 | Senateur ............. C23C 16/4486 |
| | | | | 427/248.1 |
| 2003/0007786 | A1 | | 1/2003 | Plester et al. |
| 2007/0028629 | A1 | | 2/2007 | Klemm et al. |
| 2010/0154712 | A1 | | 6/2010 | Tamura et al. |
| 2010/0247747 | A1 | | 9/2010 | Yamazaki |
| 2013/0098453 | A1 | * | 4/2013 | Boger .................... C23C 14/246 |
| | | | | 137/1 |
| 2015/0091134 | A1 | | 4/2015 | Amaratunga et al. |
| 2017/0067146 | A1 | | 3/2017 | Zhang |
| 2018/0298485 | A1 | * | 10/2018 | Zou ....................... C23C 14/548 |

FOREIGN PATENT DOCUMENTS

| | | | |
|---|---|---|---|
| DE | 102010003106 A | | 9/2011 |
| EP | 1760169 B1 | | 4/2008 |
| EP | 2813597 A1 | | 12/2014 |
| GB | 766119 A | | 1/1957 |
| JP | 53-085738 A | | 7/1978 |
| JP | 55-073866 A | | 6/1980 |
| JP | S57-169088 A | | 10/1982 |
| JP | S62-33762 A | | 2/1987 |
| JP | 06-101029 A | | 4/1994 |
| JP | 2014-136827 A | | 7/2014 |
| WO | 2008/040329 A1 | | 4/2008 |
| WO | 2010/065535 A1 | | 9/2010 |

OTHER PUBLICATIONS

International Search Report and Written Opinion dated Aug. 1, 2019, directed to International Application No. PCT/GB2019/051521; 11 pages.

Search Report dated Aug. 29, 2018, directed to GB Application No. 1809089.4; 1 page.

Notice of Reasons for Refusal received for Japanese Patent Application No. 2020-567479, dated Feb. 1, 2022, 5 pages (3 pages of English Translation and 2 pages of Original Document).

Office Action received for Chinese Patent Application No. 201980037777.6, dated Jun. 22, 2022, 18 pages (10 pages of English Translation and 8 pages of Original Document).

\* cited by examiner

VAPOUR DEPOSITION EVAPORATOR DEVICE

REFERENCE TO RELATED APPLICATION

This application is a national stage application under 35 U.S.C. 371 of International Application No. PCT/GB2019/051521, filed May 31, 2019, which claims the priority of United Kingdom Application No. 1809089.4, filed Jun. 4, 2018, the entire contents of each of which are incorporated herein by reference.

FIELD OF THE DISCLOSURE

The present disclosure relates to a vapour deposition evaporator for depositing material to a substrate. More specifically, the present disclosure relates to a steady state vapour deposition evaporator device for continuous deposition of material onto a substrate. Even more specifically, the present disclosure relates to a steady state vapour deposition evaporator device for continuous deposition of metallic material onto a moving substrate.

BACKGROUND OF THE DISCLOSURE

Thin films of metallic material can be deposited onto a substrate using vapour deposition techniques. Conventional methods include melting material in a crucible such that the material changes to a gaseous state and migrates in the direction of the substrate to be coated, where it condenses and forms a film. However, these conventional crucibles are easily adapted to provide a continuous, or steady state, vapour flux since the crucible needs to be refilled with material as it evaporates. In addition, impurities in the vapour flux need to be discarded so that they do not condense on the substrate. Therefore careful thermal load balance between the melting temperature and the evaporation temperature of the material is required.

An example of an evaporator device suitable for providing a steady state vapour flux is described in US 2007/028629. The device comprises a crucible divided into three different zones. Solid material to be vaporised is introduced to a heated melt-down zone, wherein the material becomes molten. The molten material passes from the melt-down zone to a heating zone, which is maintained at an elevated temperature which is above that of the melt-down zone but below the boiling point of the material. Within the heating zone, any impurities with a lower boiling point than the material are vaporised. The heating zone is in the form of a channel which connects the melt-down zone to an evaporator zone, which is heated to a temperature above the material's boiling point. The material vaporises within the evaporator zone and becomes deposited on a substrate positioned above the evaporator zone. The rate of vaporisation of the material from the evaporator zone is determined, inter alia, by the exposed surface area of the molten material within the evaporator zone and the temperature of the evaporator zone.

SUMMARY OF THE DISCLOSURE

In some embodiments, the present disclosure provides a vapour deposition evaporator device comprising: a crucible having an inlet through which solid material is introduced to the crucible, and an outlet through which vaporised material is released from the crucible; one or more heaters; a base; and a guide surface between the inlet and the outlet; wherein the guide surface directs outgassed vapour from molten material within the crucible away from the outlet.

The device of the present disclosure allows for a steady state vapour flux as well as an outgassed free outlet for vaporised material to be discharge for deposition. The guide surface directs impurity vapours outgassed from molten material away from the outlet. Guiding any outgassed vapours away from the outlet prevents those vapours from mixing with the vaporised material emitted from the evaporator outlet. In addition, the whole melt at or near the outlet of the device will be at approximately the same temperature and level. This reduces the amount of spits, crusts and hot spots at the surface of molten material at the outlet of the device. The vapour plumes generated should therefore uniform across the surface area of the outlet. Thus, an improved continuous vapour deposition can be achieved, with more consistent material deposition on the desired substrate to be coated. In addition, the present disclosure allows for undesired molten or gaseous material to be outgassed within the cooler parts of the crucible, so that the evolution of byproducts can be channelled to vents or ports rather than via the deposition outlet.

A conventional batch crucible will change the flux as the material is being consumed; the pool area will decrease leading to non-uniform vapour plumes as a function of the duration of the deposition. This will lead to inconsistencies in manufacturing which could lead to poorly performing products. In addition, the feeding of materials into high-temperature crucibles is exceptionally difficult as the material (cold) will impact the plume as it is fed. In contrast, the design of the continuous steady state evaporate device of the present disclosure allows for scalability for uniform deposition of material onto a substrate as there is continuous and consistent flux at the outlet of the device across the whole surface area of the outlet. This also allows for uniform deposition of material onto a moving substrate relative to the outlet of the device.

The present disclosure allows for material to be fed and made molten from beneath the outlet of the device such that the evaporation surface is not disturbed by the feeding of material. The design of the present disclosure also reduces the number of surfaces that material can condense onto, thereby improving the efficient usage of materials.

The crucible may comprise a melt-down zone, an evaporator zone, and a heating zone through which molten material passes from the melt-down zone to the evaporator zone, the inlet being positioned in the melt-down zone, and the outlet being positioned in the evaporator zone. The use of zones allows for careful temperature control to be used throughout device. In a conventional evaporant source, as the level decreases in the conical crucible the resulting flux reduces in accordance with the reduction of surface area. In contrast, the temperature of the evaporator zone can be maintained and managed separate to the melt-down and heating zones so that the evaporant material is at a constant temperature and level depending on the amount of material fed into the device, so that the material vapour flux will be broadly constant.

The crucible may comprise a cover extending over the base. The cover may define, at least in part, the guide surface. The guide surface may comprise one or more baffles connected to the base and/or the cover for guiding outgassed vapours away from the outlet of the evaporator zone. Alternatively, the cover may define, at least in part, the guide surface. For example, one or more baffles may be integral with the cover. The cover may be shaped to guide outgassed vapours away from the outlet of the evaporator zone. The guide surface may extend over the heating zone of the crucible and shaped to direct outgassed vapours away from the evaporator zone. The guide surface is may be inclined upwardly from the evaporator zone towards the melt-down zone. One or more vents for emitting the outgassed vapours may be formed in the cover. Alternatively, the cover may be shaped to guide the outgassed vapours towards the inlet of the melt-down zone. The base and the guide surface of the device may diverge from the evaporator zone. In other words, the base may be said to incline downwardly, and the guide surface may incline upwardly away from the outlet. This would enable better loading of the crucible with material to be deposited. The base of the device may be common for the heating zone, the melt-down zone and the evaporator zone.

The one or more heaters may comprise a first heater for heating the melt-down zone, and a second heater for heating the evaporator zone. A first heater is used for heating the melt-down zone to the first temperature, and a second heater is used for heating the evaporator zone to the second temperature. Depending on the composition of the material to be vaporised, the second temperature may be several hundred degrees centigrade above the first temperature. To minimize the transfer of excess energy from the evaporator zone to the melt-down zone the second heater can be spaced from the first heater. The first heater preferably extends about the melt-down zone. The first heater is can be arranged to heat the melt-down zone to a temperature which is marginally above the melting point of the material, and so may be provided by one of an induction heater and a resistive heater. The second heater preferably extends about the evaporator zone, and is preferably provided by an induction heater. The heating effect of the second heater can thus be concentrated within the evaporator zone, which can induce eddy currents in the evaporator zone to heat the molten material uniformly towards its boiling point.

In some embodiments, the evaporator zone may be trough shaped, having elongate side walls which diverge towards the outlet of the evaporator zone. The second heater extends about, or surrounds, the side walls of the evaporator zone.

The melt-down zone can be trough shaped, with elongate side walls which preferably converge towards the inlet of the melt-down zone. The first heater extends about, or surrounds, the side walls of the melt-down zone.

The evaporator device may further comprise a monitoring system for measuring the amount of material held by the crucible. In some embodiments, the monitoring system may comprise a level sensor for monitoring the level of molten material within the evaporator zone, or a load cell or other means for monitoring the combined weight of the crucible and material held within the crucible. This allows the rate at which solid material is introduced to the crucible to be controlled automatically so as to maintain a substantially uniform level of molten material within the evaporator zone, and thus maintain a substantially uniform evaporation rate of material from the crucible. The solid material may be introduced to the crucible from a conveyor, or from a hopper. Monitoring the amount of material held by the crucible can also allow other deposition process parameters to be controlled, such as the temperature of the first and/or second heater, or the pressure of the atmosphere within which the crucible is located.

In some embodiments, the present disclosure provides a method of melting and evaporating a solid material, the method comprising the steps of: heating a melt-down zone of a crucible to a first temperature; heating an evaporator zone of the crucible to a second temperature which is greater than the first temperature; introducing solid material having a melting point which is lower than the first temperature and a boiling point which is lower than the second temperature to the heated melt-down zone; flowing molten material from the melt-down zone to the evaporator zone through a heating zone; releasing vaporized material from the evaporator zone; and guiding vapours outgassed from molten material within the heating zone away from the evaporator zone.

The solid material may be introduced into the crucible in a batch process, and the vaporized material is released from the crucible in a continuous flow.

BRIEF DESCRIPTION OF THE FIGURES

Preferred features of the disclosure will now be described, by way of example only, with reference to the accompanying drawings, in which.

DETAILED DESCRIPTION OF THE DISCLOSURE

Figure 1:
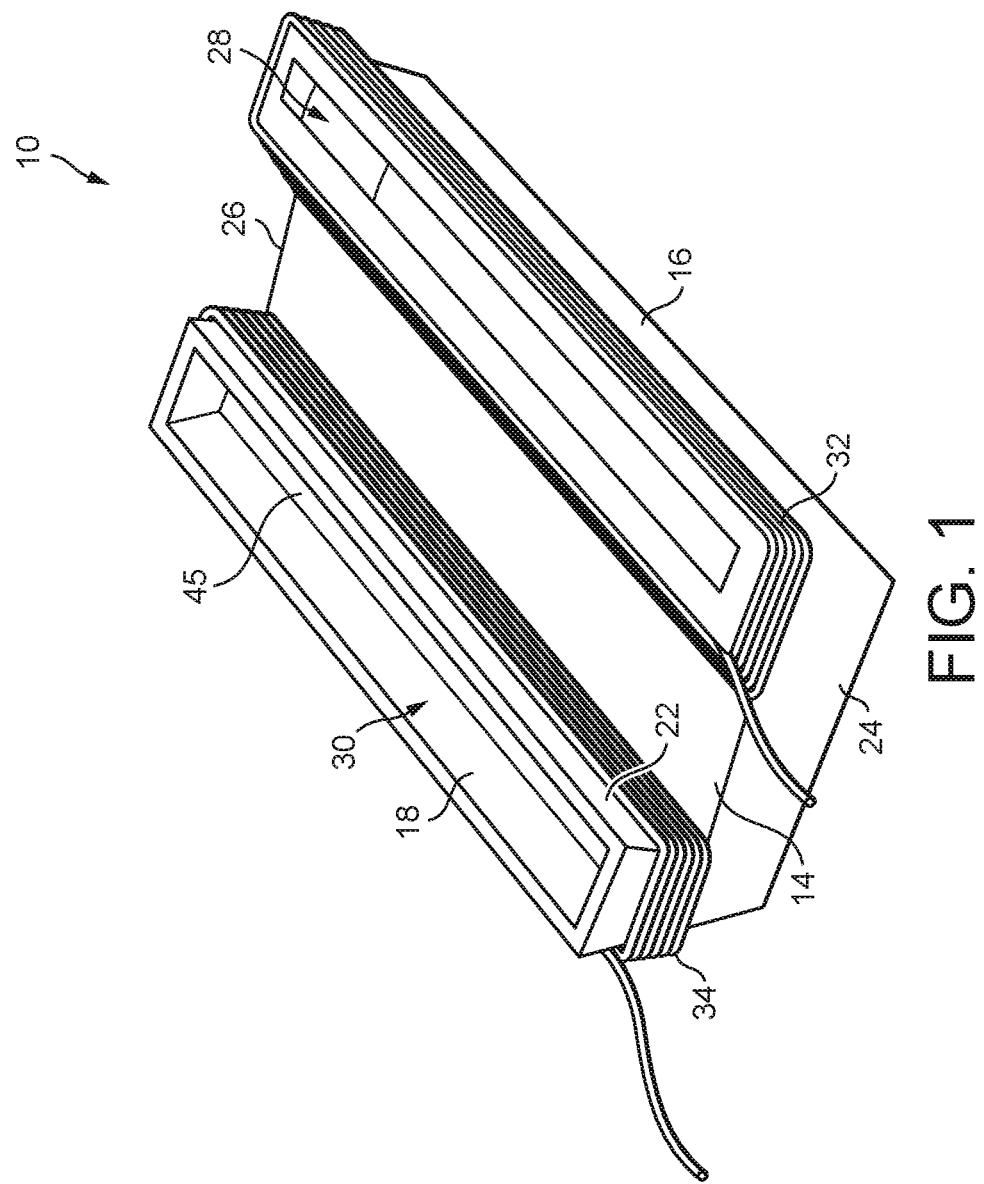
FIG. 1 illustrates a perspective view, from above, of a crucible of an evaporator device, according to some embodiments.
Figure 2:
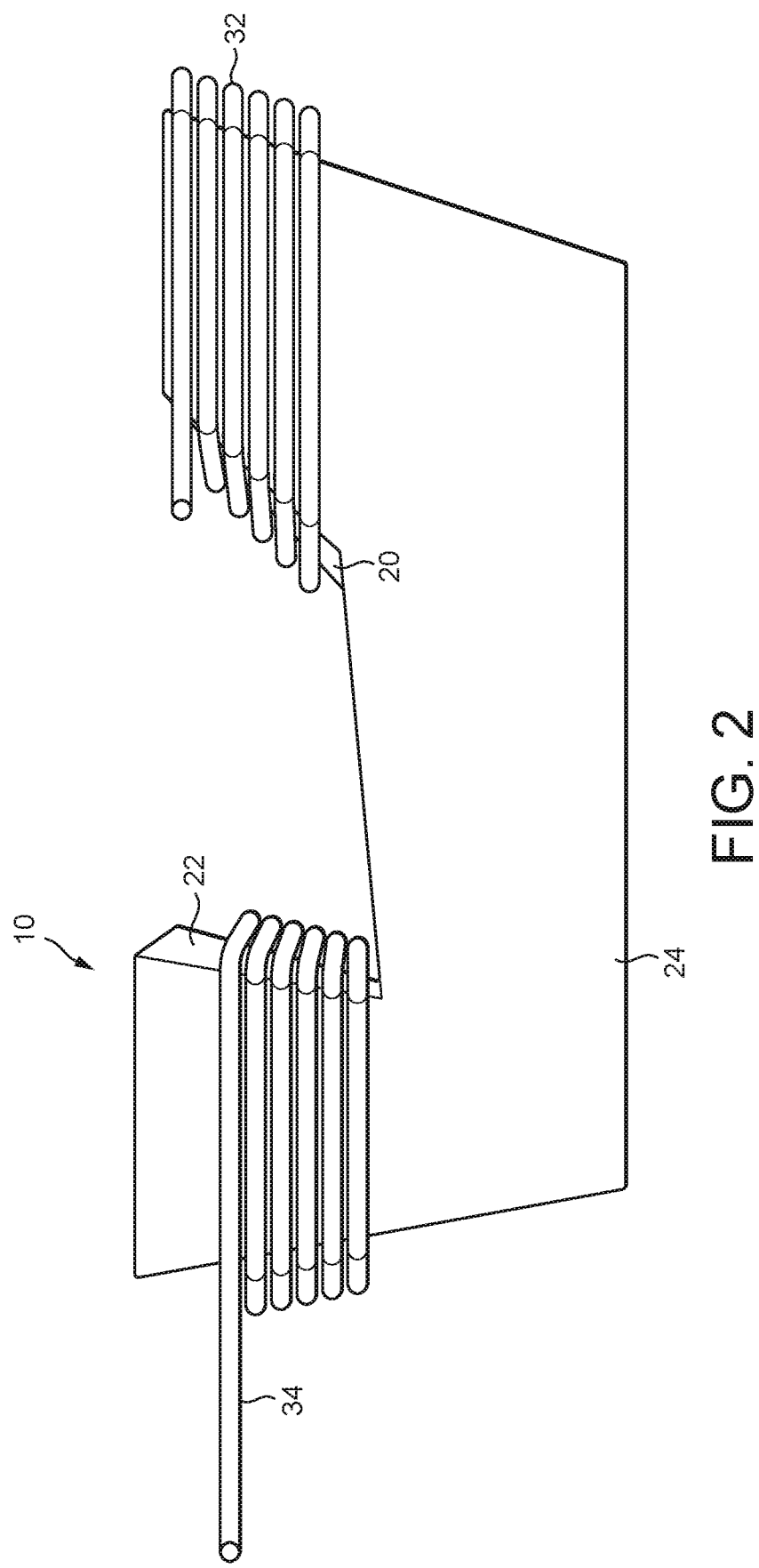
FIG. 2 is a side view of the crucible of FIG. 1, according to some embodiments.
Figure 3:
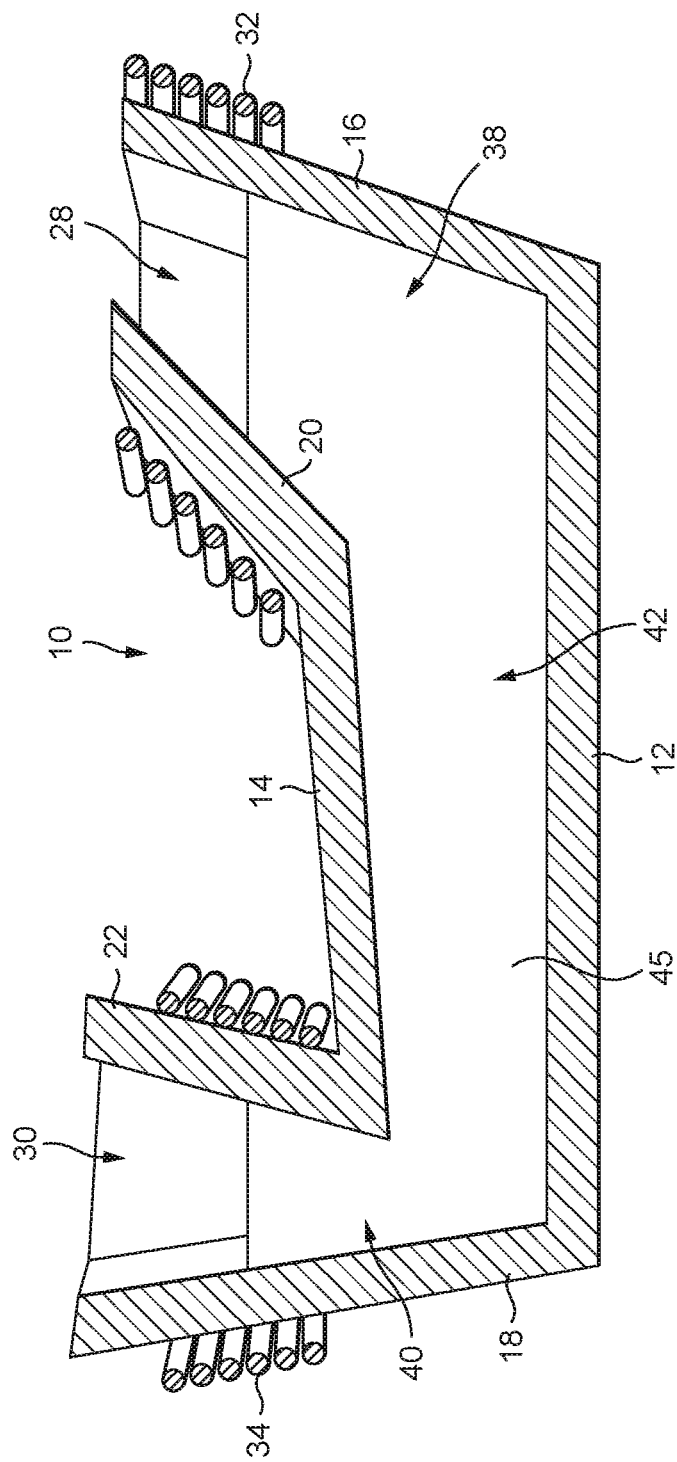
FIG. 3 illustrates a side sectional view of the crucible of FIG. 1, according to some embodiments.

FIGS. 1 to 3 illustrate a crucible 10 for use in an evaporator device for applying material to a substrate by vapour deposition. The crucible 10 comprises a base 12, a cover 14, external side walls 16, 18 extending upwardly from the base 12, internal side walls 20, 22 extending upwardly from the cover 14, and side walls 24, 26 connected to the ends of the internal side walls 20, 22. The side walls 16, 20, 24, 26 define an elongate inlet 28 of the crucible 10, and the side walls 18, 22, 24, 26 define an elongate outlet 30 of the crucible 10. In some embodiments, the base 12 and the cover 14 are substantially planar, and the cover 14 is arranged at an angle to, and so non-parallel with, the base 12.

Figure 5:
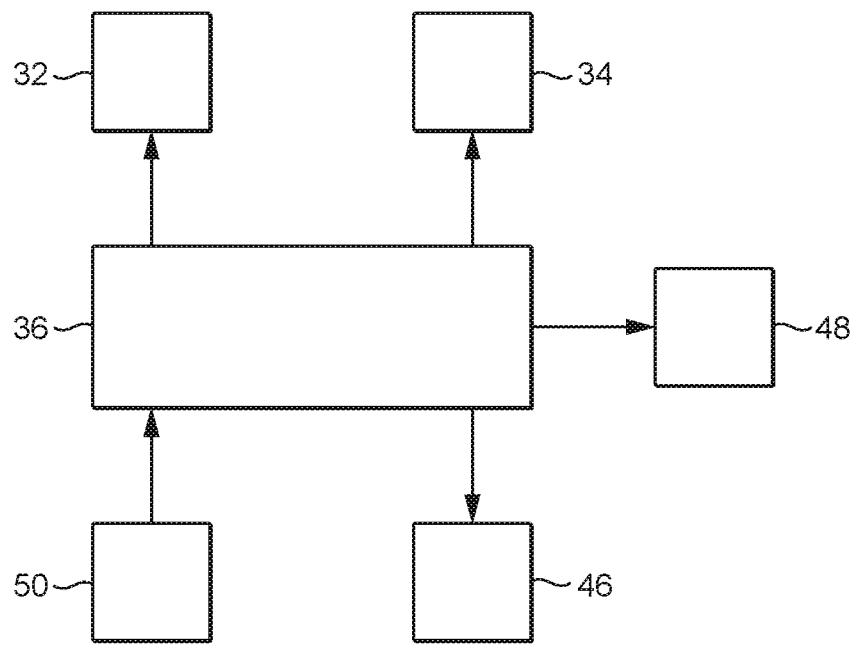
FIG. 5 illustrates schematically a control system of the evaporator device, according to some embodiments.

A first heater 32 is located beneath the inlet 28, and is in the form of a coil extending about upper portions of the side walls 16, 20, 24, 26 of the crucible 10. The first heater 32 may be a resistant heater or an induction heater. A second heater 34 is spaced from the first heater 32, and is located beneath the outlet 30. The second heater 34 is in the form of a coil which extends about upper portions of the side walls 18, 22, 24, 26 of the crucible 10. The second heater 34 is in the form of an induction heater. The heaters 32, 34 are controller by a controller 36 (illustrated schematically in FIG. 5) which controls independently the energy output from the heaters 32, 34.

Figure 4:
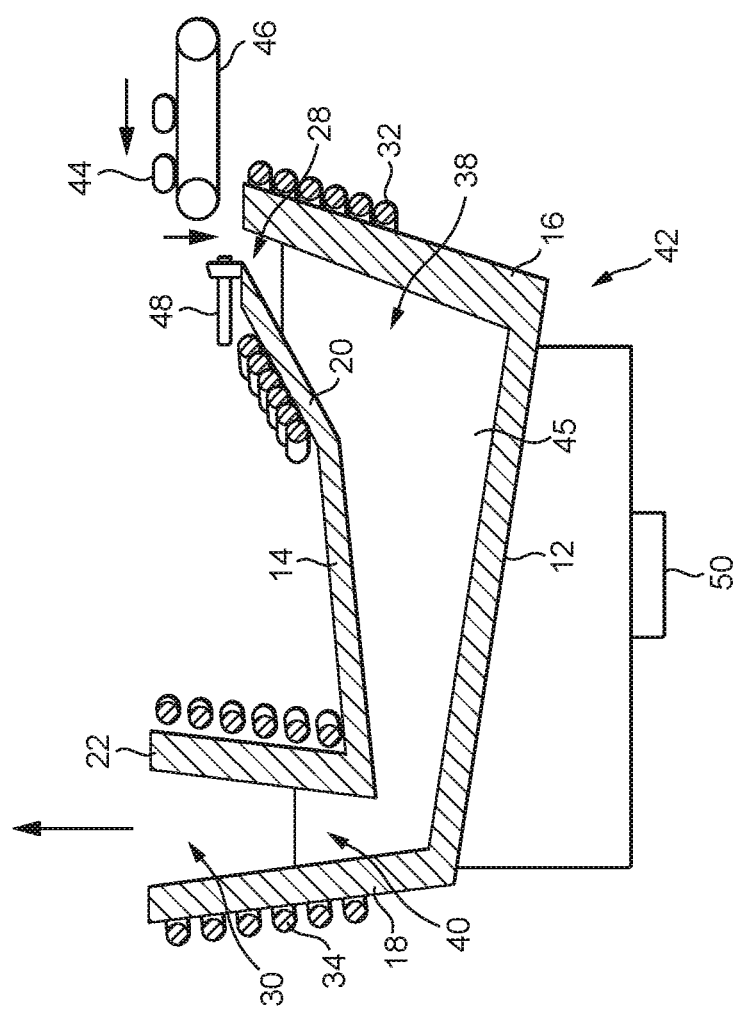
FIG. 4 illustrates schematically an evaporator device which includes the crucible of FIG. 1, according to some embodiments.

With particular reference to FIG. 3, an internal chamber of the crucible 10 is divided into three zones by the base 12, cover 14 and side walls of the crucible 10. The internal chamber comprises a melt-down zone 38 which comprises the inlet 28 of the crucible 10, an evaporator zone 40 which comprises the outlet 30 of the crucible 10, and a heating zone 42 which extends between a lower section of the melt-down zone 38 and a lower section of the evaporator zone 40. The evaporator zone 40 is trough shaped, and has elongate side walls 18, 22 which diverge towards the outlet 30. The melt-down zone 38 is also trough shaped, but has elongate side walls 16, 20 which converge towards the inlet 28. With reference to FIG. 4, the crucible 10 is mounted within the evaporator device 42 so that the base 12 is inclined upwardly from the melt-down zone 38 towards the evaporator zone 40, and the cover 14 is inclined upwardly from the evaporator zone 40 towards the melt-down zone 38. The base 12 is inclined downwardly from the evaporator zone 40 towards the melt-down zone 38 such that the base 12 and cover 14 diverge. The overall depth (and therefore amount) of material held in the melt-down zone is greater than the depth/amount of material held in the evaporator zone 40.

In use, the melt-down zone 38 is heated by the first heater 32 to a selected first temperature, and the evaporator zone 40 is heated by the second heater 34 to a selected second temperature which is higher than the first temperature. Solid material 44 to be vaporised by the evaporator device is then introduced into the crucible 10 through the inlet 28. The solid material 44 is introduced into the crucible 10 in a pelletized form for ease of handling, and to reduce outgassing of impurities from the solid material through surface area reduction of the solid material. The solid material 44 may be introduced into the crucible 10 from a hopper or, as illustrated in FIG. 3, from a conveyor 46. A rotating shutter 48 may be positioned between the conveyor 46 and the inlet 28.

The first temperature is selected so that it is higher than the melting point of the solid material 44, and so the solid material 44 melts within the melt-down zone 38. Any outgassing vapours generated as the solid material 44 melts within the melt-down zone 38 will be guided by the converging elongate side walls 16, 20 to the inlet 28 for release from the crucible 10. One or more vents may be provided for venting the outgassed vapours away from the inlet 28. Furthermore, any slag generated as the solid material 44 melts will be retained within the melt-down zone 38.

As the solid material 44 melts within the melt-down zone, molten material 45 flows through the heating zone 42 to the evaporator zone 40. The relatively greater depth of the melt-down zone 38 provides sufficient space for the solid material 44 to melt before being passed to the evaporator zone 40. This can enable a constant flux and consistency of molten material 45 to be conveyed to the lower section of the evaporator zone 40 within a desired time period.

The second temperature is selected so that it is higher than the boiling point of the molten material, and so the molten material 45 increases in temperature as it passes through the heating zone 42 towards the evaporator zone 40. Any further vapours outgassed from the molten material 45 as it passes through the heating zone 42 will be guided by the (inclined) cover 14 towards the inlet 28, or to the vents for venting the outgassed vapours away from the inlet 28. Within the evaporator zone 40, molten material 45 is vaporised and released through the outlet 30 of the crucible 10. Additional directing gas jets, baffles or plates may be provided to ensure that a uniform and collimated beam of vaporised material is directed towards a substrate located above the outlet 30.

As vaporised material is released from the outlet 30 of the crucible 10, additional solid material is introduced into the crucible 10 through the inlet 28, in some embodiments through operating the conveyor 46 and the shutter 48. The rate at which additional solid material is introduced into the crucible 10 is controlled automatically so that the surface of the molten material within the evaporator zone 40 is maintained at a relatively constant level. This may be controlled through monitoring the level of molten material within the crucible 10 or, as in some embodiments, monitoring the weight of the crucible 10 and the material held by the crucible 10 using a load cell 50 upon which the crucible 10 is mounted.

Figure 6:
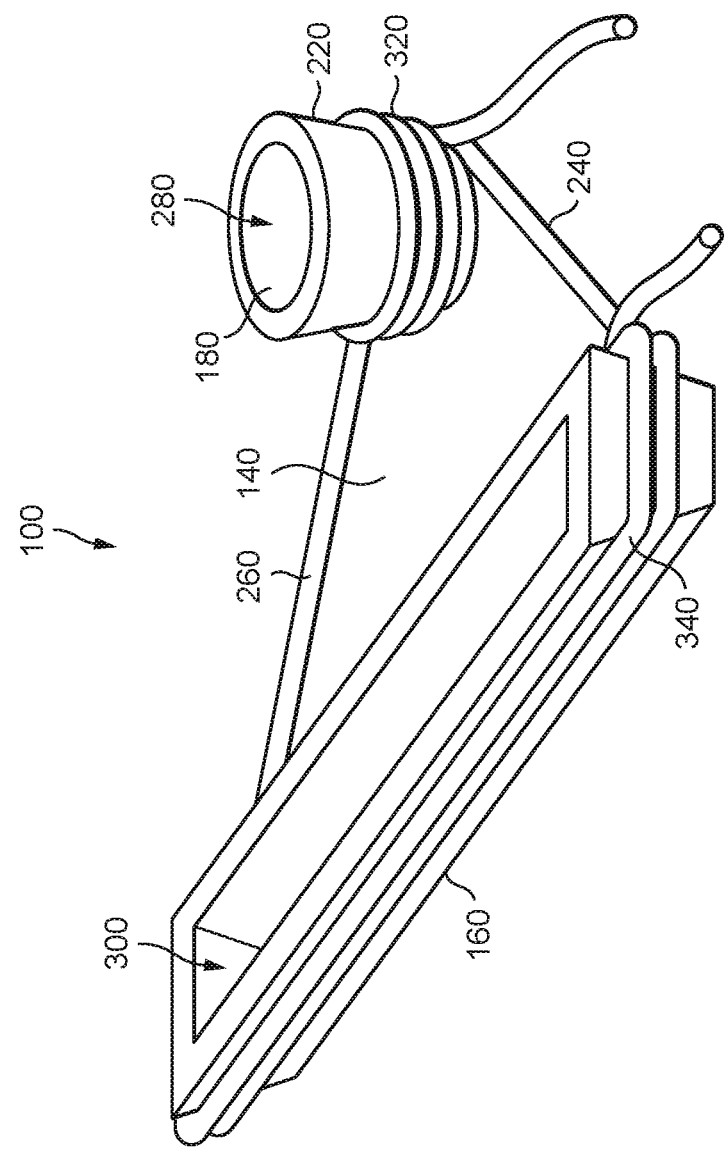
FIG. 6 illustrates a perspective view, from above, of an alternative crucible of an evaporator device, according to some embodiments.

FIG. 6 illustrate an alternative crucible design 100 for use in an evaporator device of the present disclosure, wherein the inlet 280 and side wall 220 are shaped and configured to receive powder or pellets of material. The inlet 280 and side wall 220 form a circular aperture 180. The aperture of the outlet 300 is shaped and configured differently to the inlet 280 so that a wide and uniform collimated beam of vaporised material is directed towards a substrate located above the outlet 300. As shown, the crucible 100 comprises external walls 140, 160, 240, 260 connecting the inlet 280 and outlet 300.

A first heater 320 is located beneath the inlet 280, and is in the form of a coil extending about upper portions of the side wall 220 of the crucible 100. The first heater 320 may be a resistant heater or an induction heater. A second heater 340 is spaced from the first heater 320, and is located beneath the outlet 300. The second heater 340 is in the form of a coil.

The invention claimed is:

1. A vapour deposition evaporator device comprising:
   a crucible having an inlet through which solid material is introduced to the crucible, and an outlet through which vaporised material is released from the crucible;
   one or more heaters;
   a base; and
   a guide surface,
   wherein the guide surface and the base diverge toward the inlet such that outgassed vapour from molten material within the crucible is directed away from the outlet.

2. The device of claim 1, wherein the crucible comprises a melt-down zone, an evaporator zone, and a heating zone through which molten material passes from the melt-down zone to the evaporator zone, the inlet being positioned in the melt-down zone, and the outlet being positioned in the evaporator zone.

3. The device of claim 2; wherein the crucible comprises a cover extending over the base.

4. The device of claim 3, wherein the cover defines, at least in part, the guide surface.

5. The device of claim 4, wherein the guide surface directs outgassed vapours towards the inlet.

6. The device of claim 4, wherein the guide surface is configured to direct outgassed vapours towards one or more vents of the evaporator device.

7. The device of claim 3, wherein the cover is inclined upwardly from the evaporator zone towards the melt-down zone.

8. The device of claim 2, wherein the guide surface extends over the heating zone of the crucible, and is shaped to direct outgassed vapours away from the evaporator zone.

9. The device of claim 2, wherein the heating zone extends between the melt-down zone and the evaporator zone.

10. The device of claim 9, wherein the base of the device is common for the heating zone, the melt-down zone and the evaporator zone.

11. The device of claim 2, wherein the base is inclined upwardly from the melt-down zone towards the evaporator zone.

12. The device of claim 2, wherein the base and the guide surface of the device diverge from the evaporator zone.

13. The device of claim 1, wherein the one or more heaters comprise a first heater for heating the melt-down zone, and a second heater for heating the evaporator zone.

14. The device of claim 1, wherein the guide surface and the base linearly diverge toward the inlet.

15. A method of melting and evaporating a solid material using the device of claim 1, the method comprising the steps of:
   heating a melt-down zone of the crucible to a first temperature;
   heating an evaporator zone of the crucible to a second temperature which is greater than the first temperature;
   introducing solid material having a melting point which is lower than the first temperature and a boiling point which is lower than the second temperature to the heated meltdown zone;
   flowing molten material from the melt-down zone to the evaporator zone through a heating zone;
   releasing vaporized material from the evaporator zone; and
   guiding vapours outgassed from molten material within the heating zone away from the evaporator zone.

16. The method of claim 15, wherein the solid material is introduced into the crucible in a batch process, and the vaporized material is released from the crucible in a continuous flow.

* * * * *